United States Patent
Lee et al.

(10) Patent No.: US 11,634,793 B2
(45) Date of Patent: Apr. 25, 2023

(54) QUASICRYSTALLINE MATERIAL AND SEMICONDUCTOR DEVICE APPLYING THE SAME

(71) Applicants: Samsung Electronics Co., Ltd., Suwon-si (KR); INDUSTRY-ACADEMIC COOPERATION FOUNDATION, YONSEI UNIVERSITY, Seoul (KR)

(72) Inventors: Eunsung Lee, Hwaseong-si (KR); Duseop Yoon, Seongnam-si (KR); Joungeun Yoo, Seongnam-si (KR); Dohyang Kim, Seoul (KR)

(73) Assignees: Samsung Electronics Co., Ltd., Gyeonggi-do (KR); Industry-Academic Cooperation Foundation, Yonsei University, Seoul (KR)

(*) Notice: Subject to any disclaimer, the term of this patent is extended or adjusted under 35 U.S.C. 154(b) by 388 days.

(21) Appl. No.: 16/776,729

(22) Filed: Jan. 30, 2020

(65) Prior Publication Data

US 2020/0347485 A1   Nov. 5, 2020

(30) Foreign Application Priority Data

Apr. 30, 2019 (KR) .................. 10-2019-0050723

(51) Int. Cl.
*C22C 21/02* (2006.01)
*H01L 45/00* (2006.01)

(52) U.S. Cl.
CPC ............. *C22C 21/02* (2013.01); *H01L 45/06* (2013.01); *H01L 45/14* (2013.01); *C22C 2200/06* (2013.01)

(58) Field of Classification Search
CPC ...... C22C 21/02; C22C 2200/06; C22C 30/00
See application file for complete search history.

(56) References Cited

U.S. PATENT DOCUMENTS 5,900,210 A   5/1999   Büchler et al.
8,207,064 B2  6/2012   Bandyopadhyay et al.
(Continued)

FOREIGN PATENT DOCUMENTS

CN    1709564 A    12/2005

OTHER PUBLICATIONS

A. I. Goldman, et.al. "Quasicrystals and crystalline approximants" Reviews of Modern physics, vol. 65, No. 1, Jan. 1993. (Year: 1993).*

(Continued)

*Primary Examiner* — Anthony J Zimmer
*Assistant Examiner* — Nazmun Nahar Shams
(74) *Attorney, Agent, or Firm* — Harness, Dickey & Pierce, P.L.C.

(57) ABSTRACT

A quasicrystalline material and a semiconductor device to which the quasicrystalline material is applied are disclosed. A quasicrystalline material is based on a quasicrystalline element having one or more axis of symmetry (e.g., a 2-fold axis, a 3-fold axis, a 5-fold axis, or a higher fold axes of symmetry). The quasicrystalline material is capable of phase changes between a quasicrystalline phase and an approximant crystalline phase having a further regular atom arrangement than the quasicrystalline phase. The quasicrystalline material that may be used as a phase change material and may be applied to a phase change layer of a semiconductor device.

20 Claims, 11 Drawing Sheets

(56) References Cited

U.S. PATENT DOCUMENTS

| | | |
|---|---|---|
| 8,575,008 B2 | 11/2013 | Franceschini et al. |
| 2010/0277973 A1 | 11/2010 | Altounian |
| 2012/0049144 A1 | 3/2012 | Franceschini et al. |
| 2017/0194337 A1 | 7/2017 | Lee |

OTHER PUBLICATIONS

Extended European Search Report dated Jul. 30, 2020, issued in corresponding European Patent Application No. 20164805.2.

K. Kimura et al., 'Preparation and Electrical Properties of Aluminium-based Ternary and Quaternary Quasi-crystals' *Materials Science and Engineering*, 99 (1988) pp. 435-438.

H. M. Kimura et al., 'New Quasi-crystalline and Amorphous Phases in Rapidly Quenched Al—Ge—(Cr, Mn) and Al—Si—(Cr, Mn) Alloys with High Metalloid Concentrations' *Materials Science and Engineering*, 99 (1988) pp. 449-452.

Kaoru Kimura et al., 'Electrical Resistivities of High-Quality Quasicrystals at Low Temperatures' *Journal of Non-Crystalline Solids* 117/118 (1990) p. 828-831.

K.S. Siegert et al., 'Impact of vacancy ordering on thermal transport in crystalline phase-change materials' *Reports on Progress in Physics*, 78 (2015) 013001.

Akihisa Inoue et al., 'Quasicrystalline Phase in Al—Si—Mn System Prepared by Annealing of Amorphous Phase' *Metallurgical Transactions A*, vol. 19A, Feb. 1988, pp. 383-385.

C. Dong et al., 'From clusters to phase diagrams: composition rules of quasicrystals and bulk metallic glasses' *Journal of Physics D: Applied Physics*, vol. 40, 2007, pp. R273-R291.

A. P. Tsai et al., 'Annealing-induced icosahedral glass phase in melt-spun Al—Cu—V and Al—Si—Mn alloys' *Physical Review B*, vol. 49, No. 5, Feb. 1995, pp. 3569-3573.

Zuchang Zhu, et al., "Quasicrystals' Quasicrystalline Solidification and It's Applications for Materials Engineering (1) (2)," *Heat treatment Technology and Equipment*, Nos. 1-2, pp. 68-74 of (1) and pp. 61-66 of (2), Apr. 30, 2017.

Huaxing Xiao, "Remarkable Novel Material-Quasicrystalline Material III: Formation of Quasicrystal," *Journal of Changzhou Institute of Technology*, No. 2, pp. 1-5, Apr. 30, 2004.

Office Action dated Jul. 18, 2022 issued in corresponding Chinese patent application No. 202010356577.1.

\* cited by examiner

QUASICRYSTALLINE MATERIAL AND SEMICONDUCTOR DEVICE APPLYING THE SAME

CROSS-REFERENCE TO RELATED APPLICATION

This application claims the benefit of Korean Patent Application No. 10-2019-0050723, filed on Apr. 30, 2019, in the Korean Intellectual Property Office, the disclosure of which is incorporated herein in its entirety by reference.

BACKGROUND

1. Field

The present disclosure relates to quasicrystal materials and semiconductor devices to which the quasicrystal materials are applied.

2. Description of Related Art

A phase change memory device of semiconductor devices stores data by using a difference in resistance between an amorphous state and a crystalline state according to a phase change of a compound of a material that constitutes a phase change material layer. For example, a reset current required (and/or desired) for switching to an amorphous state having a high resistance and a set current for changing to a crystalline state having a low resistance state are transferred to a phase change material layer through a transistor or a diode formed on a substrate to cause a phase change of the phase change material layer. Information is stored by a phase change of a phase change material having a high resistance in an amorphous state and a low resistance in a crystalline state. A representative phase change material includes a material of Chalcogenide Group (for example, $Ge_2Sb_2Te_5$ (GST)). However, a phase change memory that uses the material of the Chalcogenide Group as a phase change material has various points to be improved, such as the reduction in reset energy, etc.

That is, materials of the Chalcogenide Group have been studied and used as the phase change material for the past half-century, but the device performances, such as reset energy (current density), cycle endurance, switching time, thermal stability, etc. are stagnant due to the physical limitations of the GST phase change material. Thus, there is interest in developing a new material to overcome the above problems.

SUMMARY

Provided are quasicrystalline materials, based on a polyhedral quasicrystalline element and capable of phase changes, and semiconductor devices to which the quasicrystalline materials are applied.

Quasicrystal(QC) is material with a long-range translational order but with a discrete point-group symmetry disallowed for periodic systems. It usually consists of (or includes) polyhedral clusters whose shapes are associated with global rotational symmetry of QC. A quasicrystalline material that is based on a polyhedral quasicrystalline element having 2-fold axis of symmetry, 3-fold axis of symmetry, 5-fold axis of symmetry, or a higher fold-axis of symmetry, the higher-fold axis of symmetry being greater than the 5-fold axis of symmetry, wherein the polyhedral quasicrystalline element may have one of pentagonal, octagonal, decagonal, dodecagonal, icohsahedral, and triacontahedral polyhedron, the quasicrystalline material is capable of phase change between a quasicrystalline phase and an approximant crystalline phase having a further regular atom arrangement than an atom arrangement of the quasicrystalline phase, and the atom arrangement of the quasicrystalline phase is an arranged quasiperiodically.

According to an embodiment, a quasicrystalline material includes a polyhedral quasicrystalline element. The polyhedral quasicrystalline element has one or more of a 2-fold axis of symmetry, a 3-fold axis of symmetry, a 5-fold axis of symmetry, or a higher-fold axes of symmetry. The higher-fold axis of symmetry may be greater than the 5-fold axis of symmetry. The polyhedral quasicrystalline element may have one of pentagonal, octagonal, decagonal, dodecagonal, icohsahedral, and triacontahedral polyhedron, The quasicrystalline material may be capable of a phase change between a quasicrystalline phase and an approximant crystalline phase. The approximant crystalline phase may have a further regular atom arrangement than an atom arrangement of the quasicrystalline phase. The atom arrangement of the quasicrystalline phase may be arranged quasiperiodically.

In some embodiments, quasicrystalline material may include a polyhedron cluster and the polyhedron cluster may include an irregular arrangement structure.

In some embodiments, a resistance of the quasicrystalline phase may be at least twice the resistance of the approximant crystalline phase.

In some embodiments, quasicrystalline material may include an Al-based alloy including vanadium (V), chromium (Cr), or manganese (Mn). The Al-based alloy may include an icosahedral quasicrystal, a decagonal quasicrystal, or an octagonal quasicrystal.

In some embodiments the quasicrystalline material may include AlSiMn as the Al-based alloy.

In some embodiments, the quasicrystalline material may include at least one selected from the group consisting of V—Ni—Si, Cr—Ni—Si, Mn—Si, Mn—Si—Al, Mn—Fe—Si, Al-TM' (wherein TM is Ir, Pd, Pt, Os, Ru, Rh, Mn, Fe, Co, Ni, or Cr), Al—Ni—Co, Al—Cu—Mn, Al—Cu—Fe, Al—Cu—Ni, Al—Cu—Co, Al—Cu—Co—Si, Al—Mn—Pd, V—Ni—Si, Cr—Ni, V—Ni, V—Ni—Si, Al—Mn, Al—Mn—Si, Al—Li—(Cu,Mg), Al—Pd—Mn, Al—Cu—Fe, Al—Mg—Zn, Al—Re—Si, Al—Pd-TM (wherein TM is Fe, Ru or Os), Al—Cu—Ru, Al—Mg—(Ag, Cu, or Zn), Ga—Mg—Zn, Zn—Mg-RE (wherein RE is La, Ce, Nd, Sm, Gd, Dy, Ho, or Y), Ti-TM" (wherein TM" is Fe, Mn, Co, or Ni), Nb—Fe, V—Ni—Si, Pd—U—Si, and Cd—Yb.

According to an aspect of an embodiment, a semiconductor device includes a first electrode, a second electrode apart from the first electrode, and a phase change layer between the first and second electrodes, wherein the phase change layer includes a quasicrystalline material that is based on a polyhedral quasicrystalline element having one or more of 2-fold axis of symmetry, a 3-fold axis of symmetry, a 5-fold axis of symmetry, or a higher fold-axis of symmetry that is greater than the 5-fold axis of symmetry. The polyhedral quasicrystalline element may have one of pentagonal, octagonal, decagonal, dodecagonal, icohsahedral, and triacontahedral polyhedron, The quasicrystalline material may be capable of phase changes between a quasicrystalline phase and an approximant crystalline phase. The approximant crystal phase may have a further regular atom arrangement than an atom arrangement of the quasicrystalline phase. The atom arrangement of the quasicrystalline phase may be arranged quasiperiodically. A phase of the phase change layer may be configured to change between the quasicrystalline phase and the approximant crystalline phase in response to an electric signal applied to the phase change layer through the first electrode and the second electrode.

In some embodiments, the semiconductor device may include a phase change memory device, and the phase change memory device may include the phase change layer.

In some embodiments, the semiconductor device may include a neuromorphic device.

According to an embodiments, a quasicrystalline material includes a polyhedral quasicrystalline element capable of a phase change between a quasicrystalline phase and an approximant crystalline phase. The approximant crystalline phase may have a further regular atom arrangement than an atom arrangement of the quasicrystalline phase, and the atom arrangement of the quasicrystalline phase may be arranged quasiperiodically.

In some embodiments, the quasicrystalline material may be capable of forming the quasicrystalline phase without forming an amorphous phase when rapidly solidified after being plasma treated.

In some embodiments, the quasicrystalline material may include an Al-based alloy.

In some embodiments, the Al-based alloy may be represented by Chemical Formula 1,

  [Chemical Formula 1]

In Chemical Formula 1, a may be in a range of about 53 to about 68 at. %, b may be in a range of about 11 to about 27 at. %, and c may be in a range of about 16 to about 23 at. %.

In some embodiments, a semiconductor device may include a first electrode, a second electrode apart from the first electrode, and a phase change layer between the first electrode and the second electrode. The phase change layer may include the quasicrystalline material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
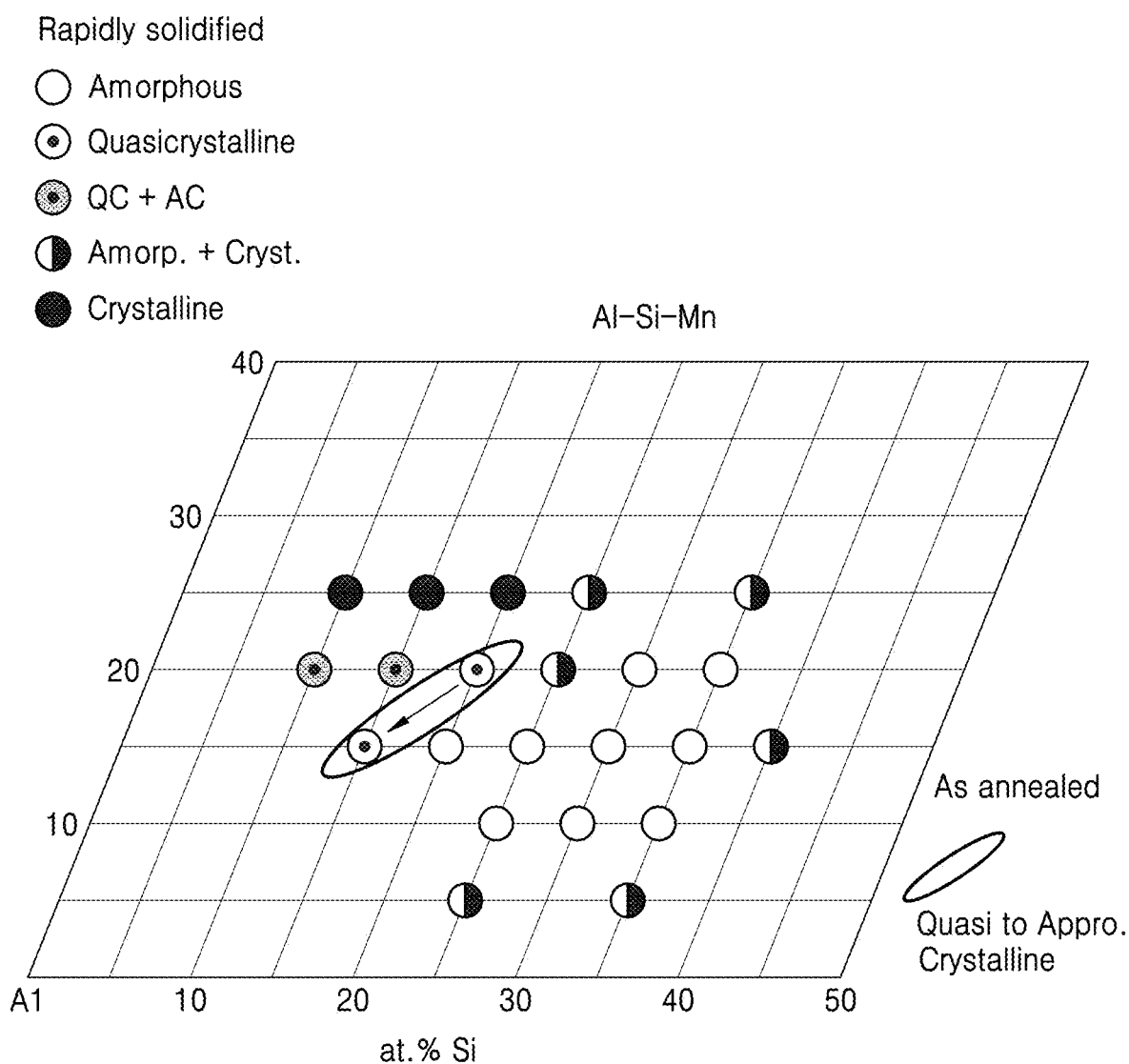
FIG. 1 shows various composition ranges of an AlSiMn alloy with respect to a phase obtainable when an AlSiMn alloy is rapidly solidified.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Quasicrystal(QC) is material with a long-range translational order but with a discrete point-group symmetry disallowed for periodic systems. It usually consists of (or includes) polyhedral clusters whose shapes are associated with global rotational symmetry of QC. A quasicrystalline material according to an embodiment may have various irregular arrangement structures of polyhedrons based on a polyhedral quasicrystalline element having an axis of symmetry of 2-fold axis, 3-fold axis, 5-fold axis, or higher fold-axis (e.g., 8-fold axis, 10-fold axis, 12-fold axis).

For example, the quasicrystalline material according to an embodiment may include one of a pentagonal quasicrystal material having an 5-fold axis of symmetry, an octagonal quasicrystals material having an 8-fold axis of symmetry, a decagonal quasicrystals material having a 10-fold axis of symmetry, a dodecagonal quasicrystalline material having a 12-fold axis of symmetry, an icosahedral quasicrystal material, triacontahedral quasicrystal material, and a stable binary quasicrystalline material having a broken icosahedral symmetry. The polyhedral quasicrystalline element may have one of pentagonal, octagonal, decagonal, dodecagonal, icohsahedral, and triacontahedral polyhedron.

In this way, the quasicrystalline material according to the embodiment is based on a polyhedral quasicrystalline element having an axis of symmetry of 2-fold axis, 3-fold axis, 5-fold axis, or higher fold-axis, and is capable of phase changes between a quasicrystalline phase and an approximant crystalline phase having a further regular atom arrangement than the quasicrystal, which is an arranged quasiperiodically and thus, may be used as a phase change material. Here, the approximant crystalline may include a crystalline.

Also, the quasicrystalline material according to an embodiment includes a polyhedral cluster having a long range order structure and may include an irregular arrangement structure of the polyhedral cluster, and due to small phase transition energy and a large specific resistance difference with respect to the quasicrystalline phase and the approximant crystalline phase having a further regular atom arrangement than the quasicrystal, it may be provided to enable a high-speed phase change.

For example, a quasicrystalline material according to an embodiment may be formed so that a resistance of the quasicrystalline phase is more than 2 times, for example, about 4 times or more than that of the approximant crystalline phase having a further regular atom arrangement than the quasicrystalline phase, which is an arranged quasiperiodically.

The quasicrystalline material according to an embodiment may include includes at least one selected from the group consisting of V—Ni—Si, Cr—Ni—Si, Mn—Si, Mn—Si—Al, Mn—Fe—Si, Al-TM' (wherein TM' is Ir, Pd, Pt, Os, Ru, Rh, Mn, Fe, Co, Ni, or Cr), Al—Fe—Mn, Al—Ni—Co, Al—Cu—Mn, Al—Cu—Fe, Al—Cu—Ni, Al—Cu—Co, Al—Cu—Co—Si, Al—Mn—Pd, Al—Li—(Cu,Mg), Al—Re—Si, Al—Pd-TM (wherein TM is Fe, Ru and Os), Al—Cu—Ru, Al—Mg—(Ag, Cu, or Zn), Ga—Mg—Zn V—Ni—Si, Cr—Ni,V—Ni, V—Ni—Si, Al—Mn, Al—Mn—Si, Al—Li—Cu, Al—Pd—Mn, Al—Cu—Fe, Al—Mg—Zn, Zn—Mg-RE (wherein RE is La, Ce, Nd, Sm, Gd, Dy, Ho, or Y), Ti—Zr—Ni, Ti-TM'' (wherein TM is Fe, Mn, Co, or Ni), Nb—Fe, V—Ni—Si, Pd—U—Si, and Cd—Yb. For example, the quasicrystalline material according to an embodiment may include an icosahedral quasicrystal alloy based on Al, for example, AlSiMn. For example, the quasicrystalline material according to an embodiment may include one of the octagonal quasicrystal materials, for example, V—Ni—Si, Cr—Ni—Si, Mn—Si, Mn—Si—Al, and Mn—Fe—Si. For example, the quasicrystalline material according to an embodiment may include one of decagonal quasicrystal materials, for example, Al-TM' (wherein TM' is Ir, Pd, Pt, Os, Ru, Rh, Mn, Fe, Co, Ni, or Cr), Al—Fe—Mn, Al—Ni—Co, Al—Cu—Mn, Al—Cu—Fe, Al—Cu—Ni, Al—Cu—Co, Al—Cu—Co—Si, Al—Mn—Pd, V—Ni—Si, and Cr—Ni. For example, the quasicrystalline material according to an embodiment may include one of dodecagonal quasicrystal materials, for example, Cr—Ni, V—Ni, and V—Ni—Si. For example, the quasicrystalline material according to an embodiment may include one of icosahedral quasicrystal materials, for example, Al—Mn, Al—Mn—Si, Al—Li—Cu, Al—Pd—Mn, Al—Cu—Fe, Al—Mg—Zn, Zn—Mg-RE (wherein RE is La, Ce, Nd, Sm, Gd, Dy, Ho, or Y), Ti—Zr—Ni, Ti-TM'' (where TM'' is Fe, Mn, Co, or Ni), Nb—Fe, V—Ni—Si, and Pd—U—Si. Also, for example, the quasicrystalline material according to an embodiment may include a stable binary quasicrystalline material having a broken icosahedral symmetry, for example, Cd—Yb.

Here, the Al—Ni—Co, Al—Cu—Co, Al—Cu—Co—Si, Al—Mn—Pd, Al—Li—Cu, Zn—Mg-RE, and Cd—Yb may be materials in which stable phases are present.

In some embodiments, the quasicrystalline material may be represented by Chemical Formula 1, $Al_aSi_bMn_c$, [Chemical Formula 1]

wherein, in Chemical Formula 1, a may be in a range of about 53 to about 68 at. % (and/or about 55 to about 66 at. %), b may be in a range of about 11 to about 27 at. % (and/or about 14 to about 25 at. %), and c may be in a range of about 16 to about 23 at. % (and/or about 19 to about 21 at. %).

The quasicrystalline materials according to various embodiments, which are based on a quasicrystalline element as described above and are provided so that the phase change of a quasicrystalline state and a crystalline state is possible, may be applied to a phase change layer of a semiconductor device. Here, the crystalline state may include an approximant crystalline state having a further regular atomic arrangement than the quasicrystalline state. In a semiconductor device in which a quasicrystalline material is applied to a phase change layer, a phase change of a quasicrystalline state and a crystalline state is possible, and, since an energy change in a process of transition from a quasicrystal to a crystal is not large, a rapid phase change speed may be expected, and thus, a semiconductor memory device, such as a phase change memory device or a neuromorphic device, may be realized, and accordingly, a required (and/or desired) phase change speed may be obtained.

Hereinafter, the phase transition of an icosahedral quasicrystal alloy based on Al, for example, an AlSiMn icosahedral quasicrystal, is described as an example of a quasicrystalline material according to an embodiment.

FIG. 1 shows various composition ranges of an AlSiMn alloy with respect to a phase obtainable when an AlSiMn alloy is rapidly solidified.

Referring to FIG. 1, when the AlSiMn alloy is rapidly solidified, it may be seen that there is a composition range in which a two-step phase transition starting from an amorphous phase to a quasicrystalline phase and again to a crystalline phase occurs, and there is a composition range in which a one-step phase transition occurs, that is, a quasicrystalline phase is formed and the quasicrystalline phase is changed to an approximant crystalline phase having a further regular atom arrangement than the quasicrystal when annealing.

In FIG. 1, QC indicates a quasicrystalline phase, and AC indicates an approximant crystalline having a further regular atomic arrangement than the quasicrystalline phase, Amorp. indicates an amorphous phase, and Cryst. indicates a crystalline phase. QC+AC indicates a state in which a quasicrystalline phase and an approximant crystalline phase are present, and Amorp.+Cryst. indicates a state in which an amorphous phase and a crystalline phase are present.

Table 1 shows a composition showing one-step phase transition characteristics of an AlSiMn alloy according to an embodiment and a composition showing two-step phase transition characteristics as a comparative example.

TABLE 1

| No. | Phase transition steps | Compositions (at. %) | ICP compositions (at. %) | | |
|---|---|---|---|---|---|
| | | | Al | Si | Mn |
| Al50 | 2: | $Al_{50}Si_{35}Mn_{15}$ | 50 | 34.8 | 15.2 |
| Al60 | Amorp. → Quasi- → | $Al_{60}Si_{25}Mn_{15}$ | 59.6 | 25.3 | 15.1 |
| Al63 | Crystalline phase | $Al_{63}Si_{22}Mn_{15}$ | 62.6 | 22.3 | 15.1 |
| Al56 | 1: | $Al_{56}Si_{25}Mn_{19}$ | 55.6 | 24.9 | 19.5 |
| AlSi20 | Quasi- → | $Al_{60}Si_{20}Mn_{20}$ | 59.7 | 20.0 | 20.3 |
| Al65 | Crystalline | $Al_{65}Si_{15}Mn_{20}$ | 65.2 | 14.8 | 20.0 |

In Table 1, an AlSiMn alloy having a composition of example samples $Al_{56}$, $AlSi_{20}$, and $Al_{65}$ shows one-step phase transition characteristics, and an AlSiMn alloy having a composition of comparative samples $Al_{50}$, $Al_{60}$, and $Al_{63}$ shows two-step phase transition characteristics. The compositions of the AlSiMn alloys of the samples shown in Table 1 show results of measuring characteristics of AlSiMn ribbons by using inductive coupled plasma (ICP) after forming the AlSiMn ribbons having different compositions. Here, the AlSiMn ribbon has a thickness of about 20 μm and a width of about 2 mm.

In Table 1, the one-step phase transition (Quasi→Crystalline) shows that, when the AlSiMn alloy of the example samples $Al_{56}$, $AlSi_{20}$, and $Al_{65}$ are rapidly solidified, the samples are changed to a quasicrystalline phase, and when annealing starting from the quasicrystalline phase, the quasicrystalline phase is changed to an approximant crystalline phase having a more regular atom arrangement than the quasicrystalline phase. The two-step phase transition (Amorp.→Quasi.→Crystalline phase) shows that, when the AlSiMn alloys of the comparative samples $Al_{50}$, $Al_{60}$, and $Al_{63}$ are rapidly solidified, starting from an amorphous phase, the AlSiMn alloy samples are changed to a quasicrystalline phase and then to an approximant crystalline having a more regular atom arrangement than the quasicrystalline phase.

Figure 2:
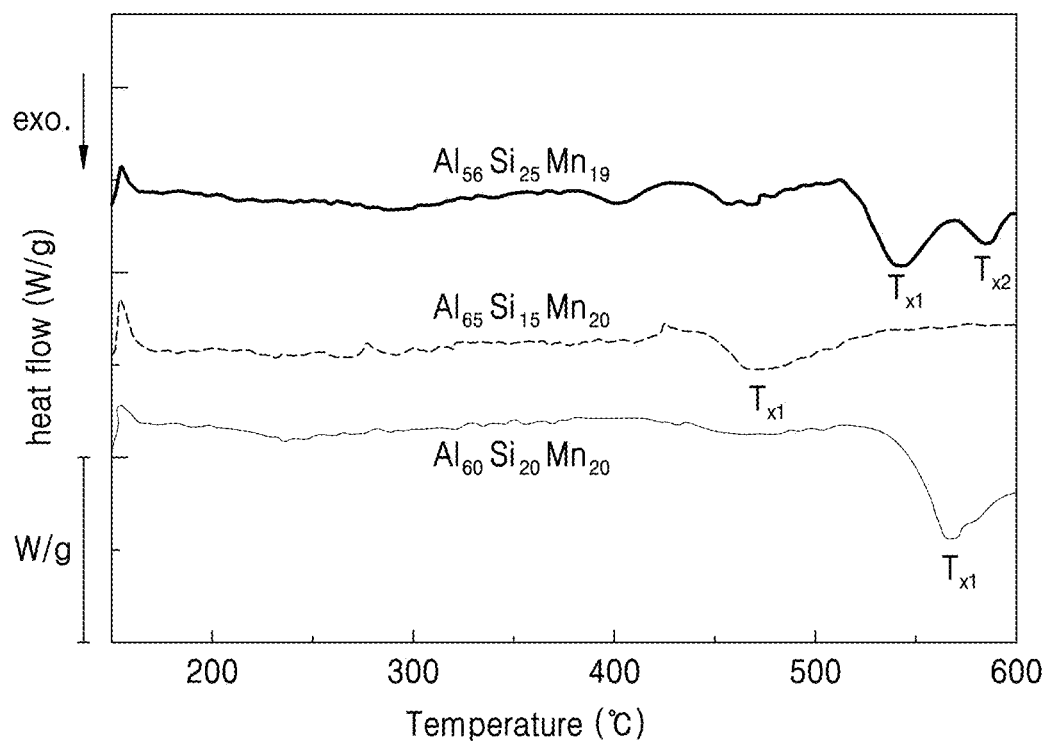
FIG. 2 is a graph showing differential thermal analysis (DSC) curves depending on a temperature change applied to an example sample when an AlSiMn alloy has a composition of the samples $Al_{56}$, $AlSi_{20}$, and $Al_{65}$ in Table 1 and is in one-step phase transition.
Figure 3:
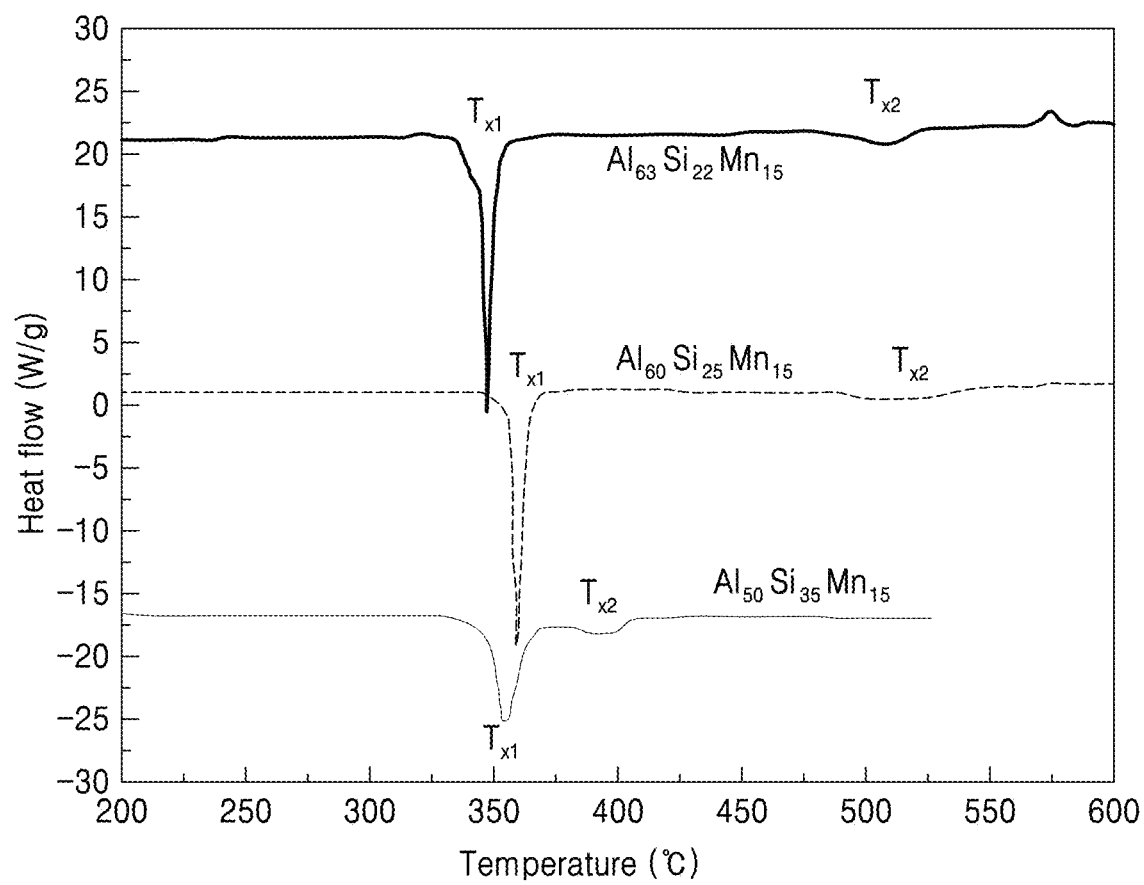
FIG. 3 is a graph showing DSC curves according to a temperature change applied to a comparative sample when the AlSiMn alloy has the composition of the comparative samples $Al_{50}$, $Al_{60}$, and $Al_{63}$ in Table 1 and is in two-step phase transition.

Table 2 shows example phase transition temperatures and amounts of calorific value ΔH generated during phase transitions when the samples of the AlSiMn alloy of Table 1 undergo phase transitions in one or two-step phase transitions. FIG. 2 shows a differential thermal analysis (DSC) curve according to a temperature change applied to an example sample when the AlSiMn alloy has a composition of the samples $Al_{56}$, $AlSi_{20}$, and $Al_{65}$ in Table 1 and undergoes the one-step phase transition. FIG. 3 shows DSC curves according to a temperature change applied to a comparative sample when the AlSiMn alloy has the composition of the comparative samples $Al_{50}$, $Al_{60}$, and $Al_{63}$ in Table 1 and the transition undergoes the two-step phase transition.

TABLE 2

| Phase transition steps | Compositions (at. %) | Phase transition temperature (° C.) | | ΔH (J/g) | |
|---|---|---|---|---|---|
| | | $T_{x1}$ | $T_{x2}$ | $ΔH_1$ | $ΔH_1$ |
| 2 Step Amorp. → Quasi- → Crystalline | $Al_{50}Si_{35}Mn_{15}$ | 343 | 381 | −122 | −20 |
| | $Al_{60}Si_{25}Mn_{15}$ | 356.1 | 476.5 | −172.9 | −57.2 |
| | $Al_{63}Si_{22}Mn_{15}$ | 344.1 | 490.1 | −179.5 | −32.8 |
| 1 Step Quasi- → Crystalline | $Al_{56}Si_{25}Mn_{19}$ | 543.8 | 586.8 | 3.04 | 0.85 |
| | $Al_{60}Si_{20}Mn_{20}$ | 568.7 | N/A | TBD | N/A |
| | $Al_{65}Si_{15}Mn_{20}$ | 470.9 | N/A | 3.65 | N/A |

Referring to Table 2 and graphs of FIG. 2, a composition showing one exothermic peak from the DSC curve like the example samples $Al_{56}$, $AlSi_{20}$, and $Al_{65}$ indicates a composition region in which quasicrystal is formed without forming an amorphous phase when rapid solidifying occurs, and the transition undergoes the one-step phase transition (quasicrystal→crystal). Samples may be rapidly solidified using a quenching process, but inventive concepts are not limited thereto.

Referring to Table 2 and graphs of FIG. 3, a composition showing two exothermic peaks from the DSC curve like the comparative samples $Al_{50}$, $Al_{60}$, and $Al_{63}$ is a composition in which an amorphous phase is formed when rapid solidifying occurs, and the transition undergoes the two-step phase transition (amorphous→quasicrystal→crystal).

In Table 2, the measurement results of the amount of heat ΔH generated during the phase transition for the example sample $AlSi_{20}$ are not calculated. This is because the temperature applied to the example sample was limited to 600° C. Referring to the graphs of FIG. 2, in the case of the example sample $AlSi_{20}$, it is seen that one exothermic peak is shown and a one-step phase transition (quasicrystal→crystal) characteristic is shown. In the case of the example sample Al56, phase transitions occur in two places ($T_{x1}$ and $T_{x2}$), and in the case of a composition of the example sample Al56, it is seen that different types of approximant crystalline phases are generated.

Referring to Table 2 again, in the case of the comparative samples $Al_{50}$, $Al_{60}$, and $Al_{63}$ in which two-step phase transition occurs, it is seen that the calorific value $ΔH_2$ at the second phase transition temperature $T_{x2}$ is much less than the calorific value $ΔH_1$ at the first phase transition temperature $T_{x1}$.

Furthermore, in the case of the example samples $Al_{56}$, $AlSi_{20}$, and $Al_{65}$ in which one-step phase transition occurs, it is seen that the calorific value $ΔH_1$ itself is very small at the first phase transition temperature $T_{x1}$. This may denote that an energy change in a process of phase transition from a quasicrystal to a crystal is not large. In this way, since the energy change is not large, a rapid phase change may be achieved when a quasicrystalline material is used as a phase change material in which a one-step phase change from a quasicrystal to a crystal occurs, Also, when a composition of the quasicrystalline material is appropriately selected, since a melting point is about 600° C. or less on a bulk basis, it is possible to realize a semiconductor device that is operated at low power when the quasicrystalline material is applied to the semiconductor device.

As described above, in the quasicrystalline material according to the present embodiment, a one-step phase transition occurs, and since the energy change in a process of phase transition from a quasicrystal to a crystal is not large, a rapid phase change speed may be expected, and a low power operation is possible.

Figure 4:
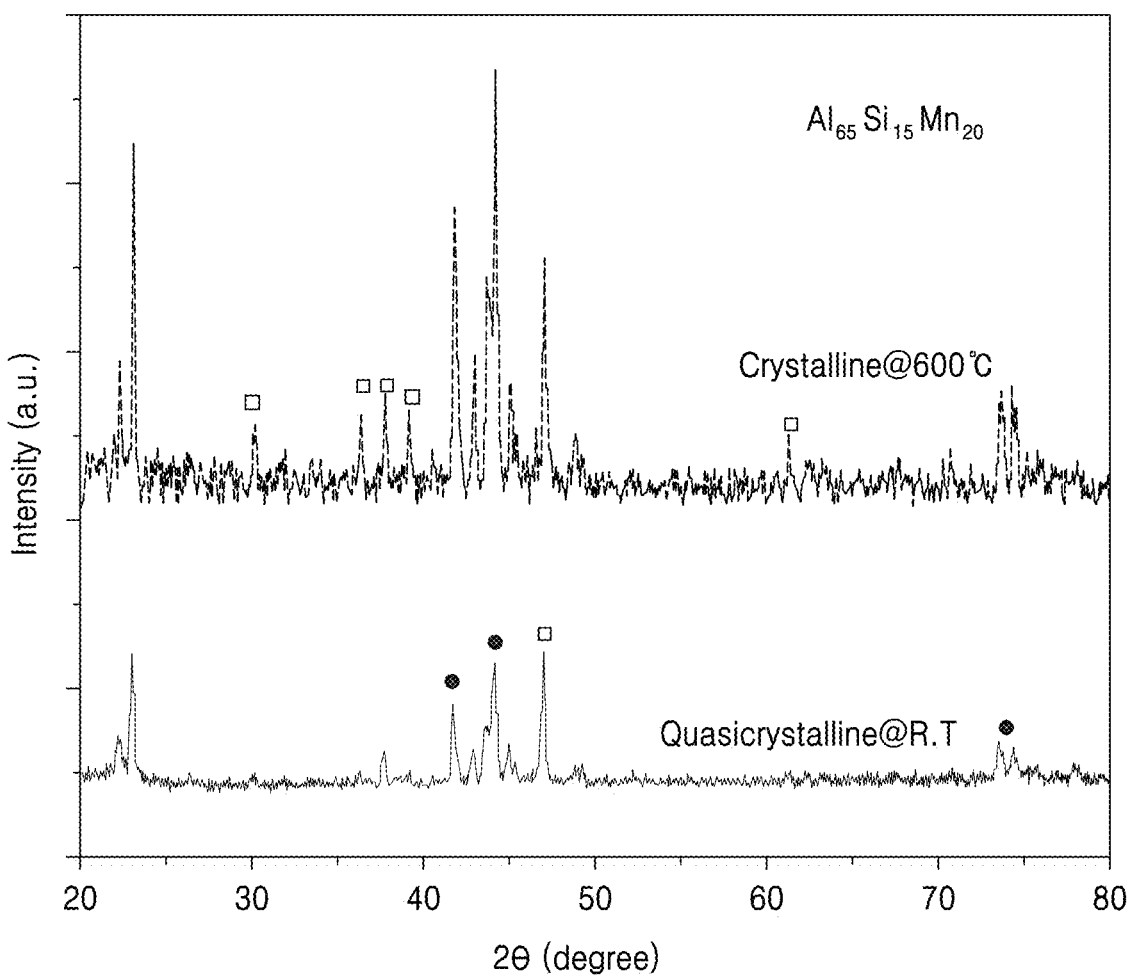
FIG. 4 is a graph showing an XRD pattern of a phase transition phenomenon in a sample $Al_{65}Si_{15}Mn_{20}$.
Figure 5:
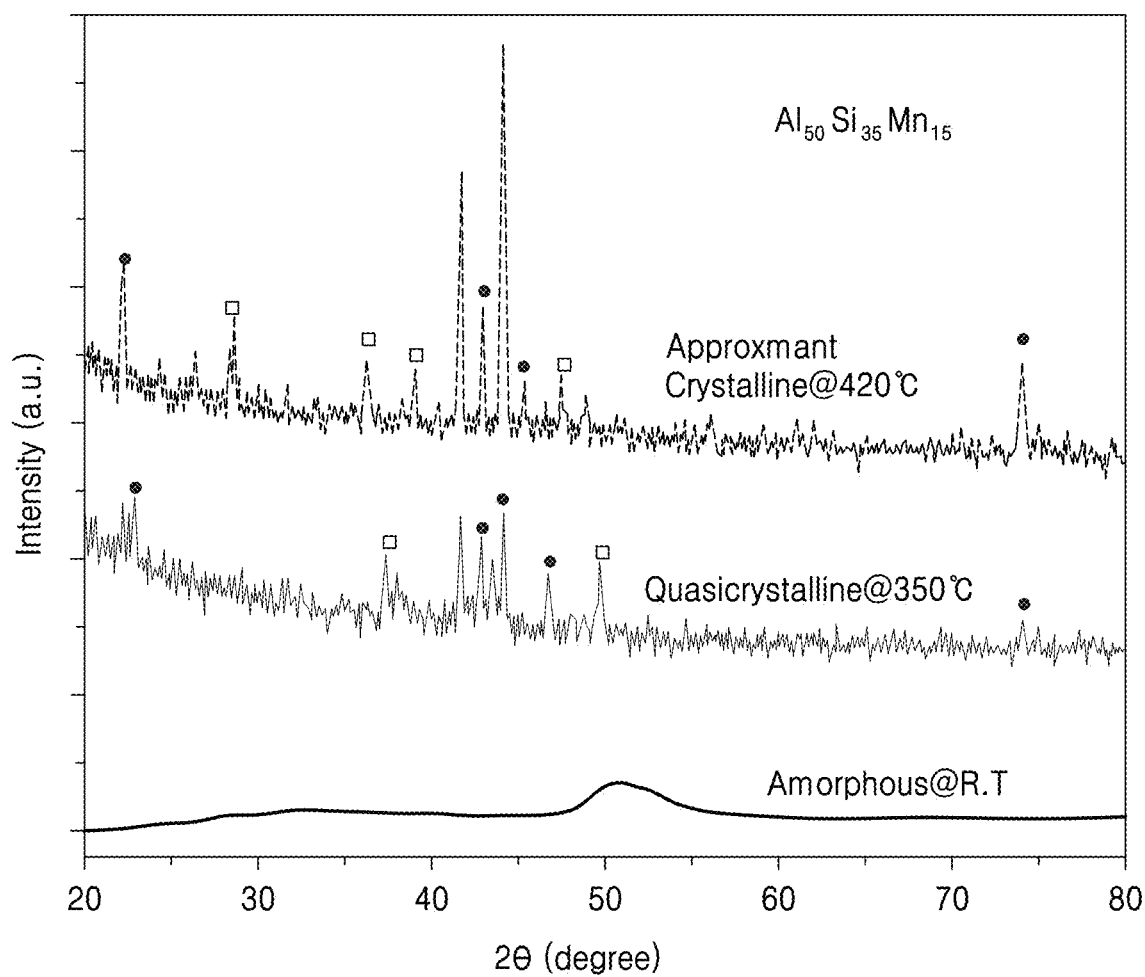
FIG. 5 is a graph showing an XRD pattern of a phase transition phenomenon in a sample $Al_{50}Si_{35}Mn_{15}$.

FIGS. 4 and 5 show XRD patterns of a phase transition phenomenon measured in a sample $Al_{65}Si_{15}Mn_{20}$ and a comparative sample $Al_{50}Si_{35}Mn_{15}$, respectively.

Referring to FIG. 4, the sample $Al_{65}Si_{15}Mn_{20}$ shows a one-step phase transition characteristic (quasicrystal→approximant crystal). Referring to FIG. 5, the comparative sample $Al_{50}Si_{35}Mn_{15}$ shows a two-step phase transition characteristic (amorphous→quasicrystal→approximant crystal).

Figure 6:
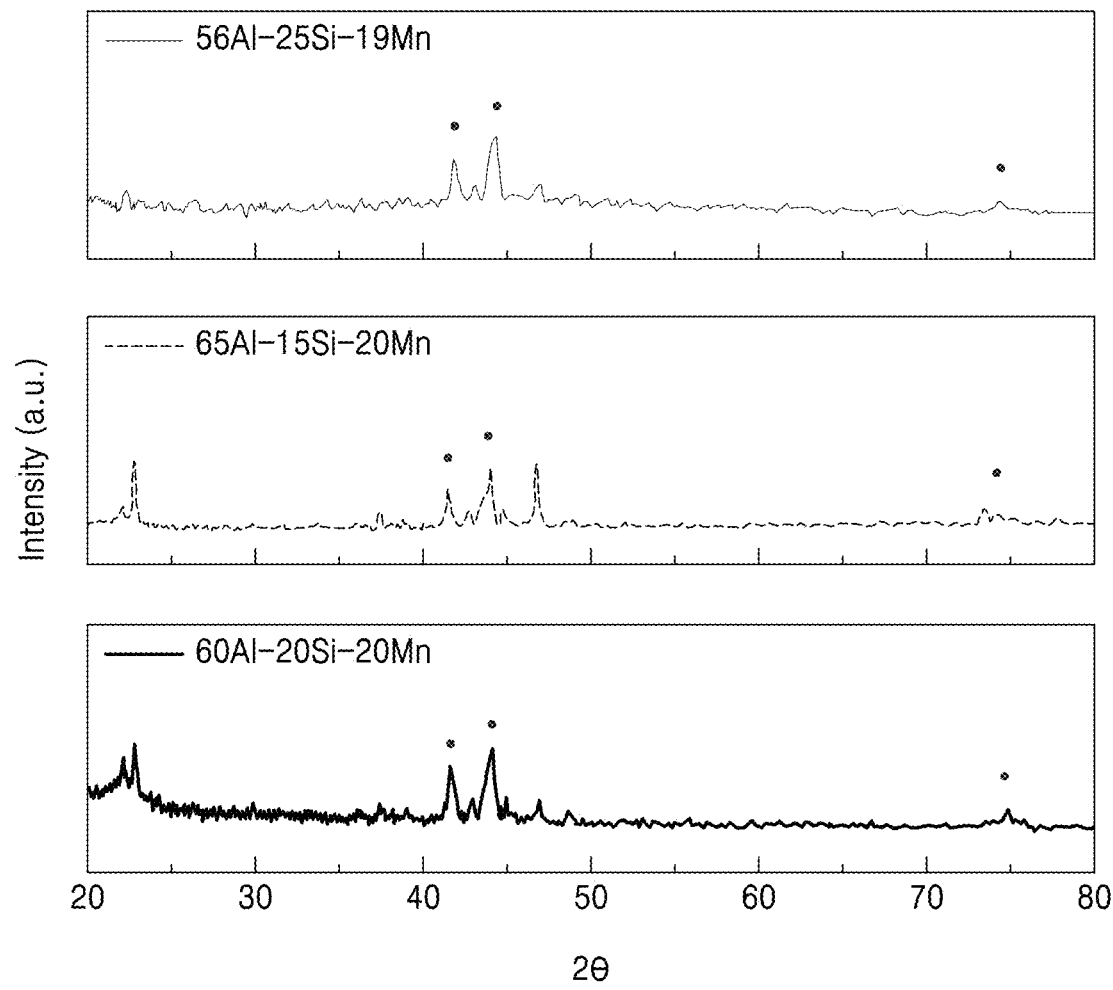
FIG. 6 shows XRD patterns showing the appearance of a quasicrystalline phase when samples $Al_{56}$, $AlSi_{20}$, $Al_{65}$ of Table 1 and Table 2 are rapidly solidified.
Figure 7:
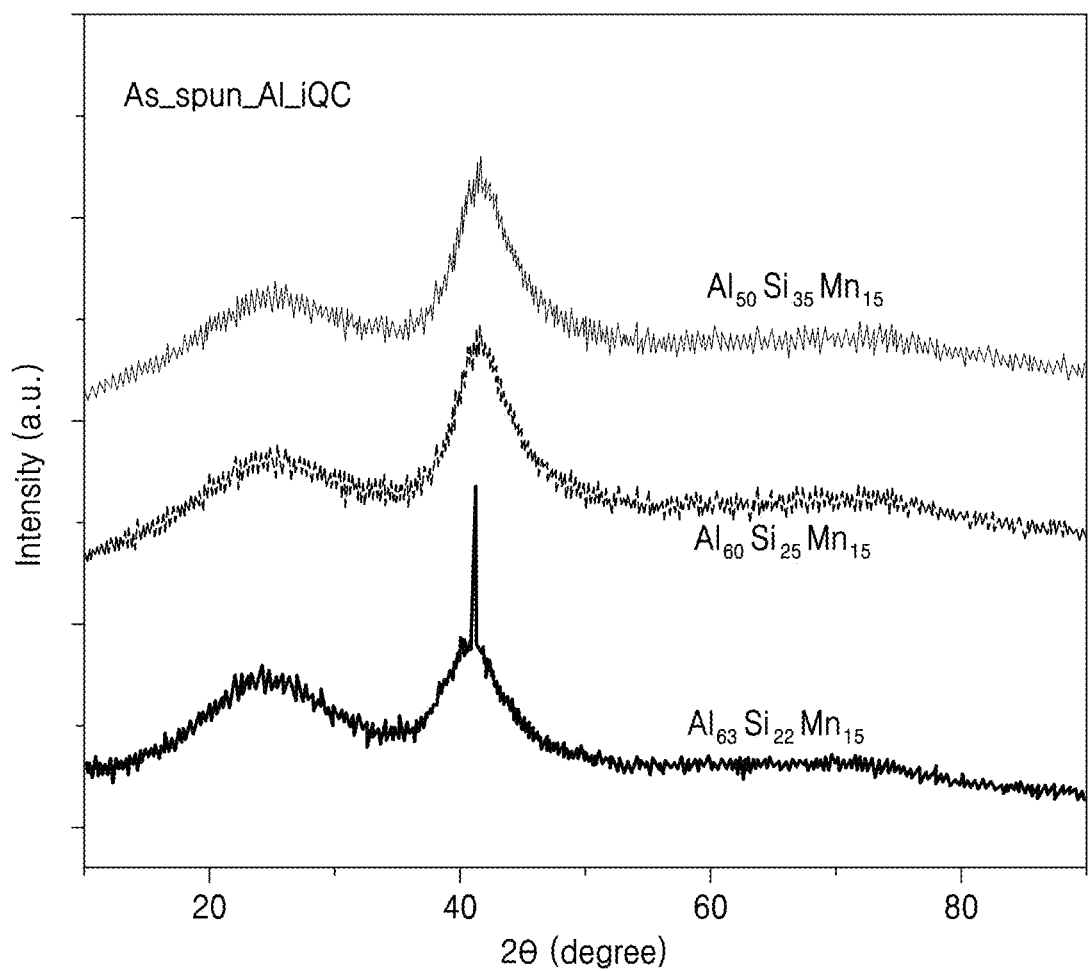
FIG. 7 is a graph showing XRD patterns showing an amorphous state when comparative samples $Al_{50}$, $Al_{60}$, and $Al_{63}$ of Table 1 and Table 2 are rapidly solidified.

FIG. 6 shows XRD patterns showing the appearance of a quasicrystalline phase when the example samples $Al_{56}$, $AlSi_{20}$, and $Al_{65}$ of Table 1 and Table 2 are rapidly solidified. FIG. 7 shows XRD patterns showing an amorphous state when the comparative samples $Al_{50}$, $Al_{60}$, and $Al_{63}$ of Table 1 and Table 2 are rapidly solidified.

As shown in FIG. 6, when a quasicrystalline phase is observed during a rapid solidifying, a one-step phase transition (quasicrystal→approximant crystal) may occur. As shown in FIG. 7, when an amorphous phase is observed during rapid solidifying, a two-step phase transition (amorphous→quasicrystal→approximant crystal) may be achieved.

Figure 8:
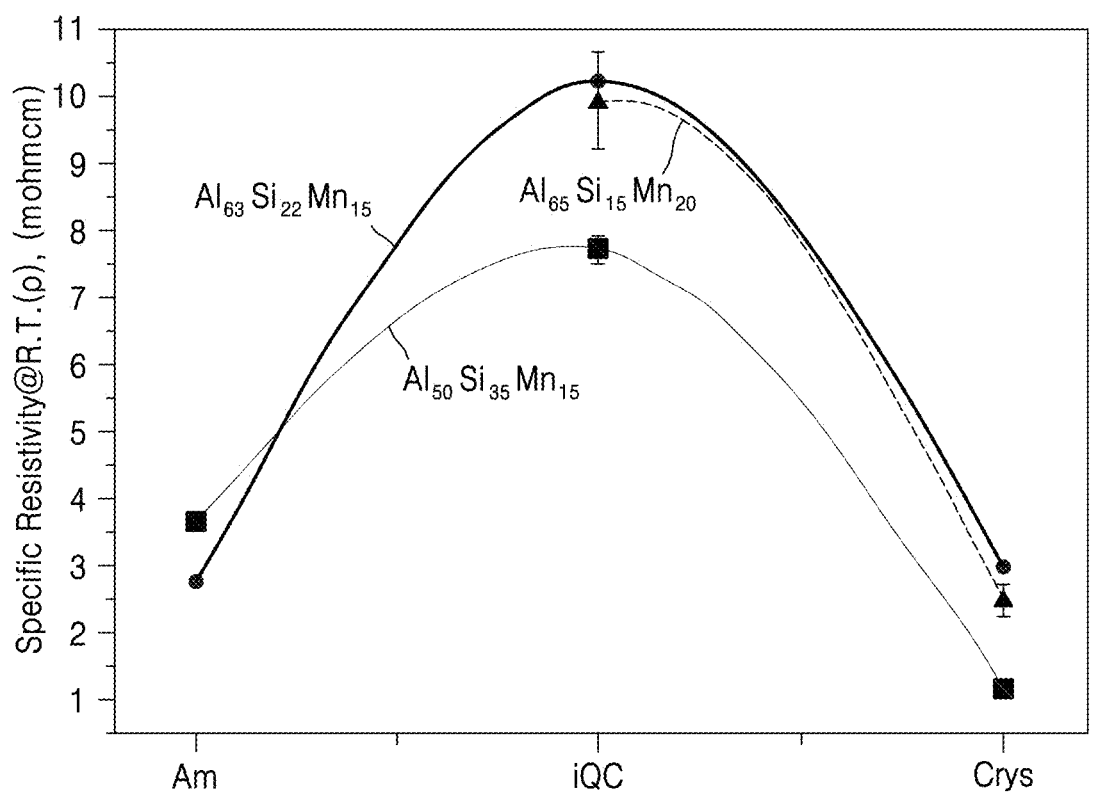
FIG. 8 is a graph showing measurement results of specific resistance of comparative samples $Al_{50}$ and $Al_{63}$ and an example sample $Al_{65}$, which are Al—Si—Mn based iQC (icosahedral quasicrystal) by using a 4-point probe in each phase step.

Table 3 and FIG. 8 show measurement results of specific resistance of each of the comparative samples ($Al_{50}$ and $Al_{63}$) and the example sample $Al_{65}$, which are Al—Si—Mn based iQC (icosahedral quasicrystal) by using a 4-point probe in each phase step. In Table 3 and FIG. 8, Amor- and Am indicate amorphous phases, QC and iQC indicate quasicrystal phases, and Crys and X'tal indicate crystal or approximant crystal phases.

TABLE 3

| No. | annealing temperature (° C.) | surface resistance (Ω/□) | | | thickness | average resistivity value | phase |
|---|---|---|---|---|---|---|---|
| AI50 | As-spun RT | 1.968 | 1.747 | 1.814 | 20 | 3.686 | Amor- |
| | 350 | 3.537 | 3.805 | — | 20 | 7.738 | QC |
| | 420 | 0.588 | 0.591 | 0.576 | 20 | 1.17 | Xtal |
| AI63 | As-spun RT | 1.367 | 1.365 | 1.407 | 20 | 2.765 | Amor- |
| | 400 | 5.117 | — | — | 20 | 10.234 | QC |
| | 550 | 1.257 | 1.207 | 1.12 | 25 | 2.987 | X'tal |

TABLE 3-continued

| No. | annealing temperature (° C.) | surface resistance (Ω/□) | | | thickness | average resistivity value | phase |
|---|---|---|---|---|---|---|---|
| Al65 | As_spun_RT | 6.14 | 5.703 | 4.712 | 18 | 9.933 | QC |
|  | 600 | 1.362 | 1.622 | 1.152 | 18 | 2.482 | Xtal |

Referring to Table 3 and FIG. 8, it is seen that, of the amorphous phase, the quasicrystalline phase, and the crystalline phase, the specific resistance of the quasicrystalline phase is the largest. Next, the magnitude of the specific resistance is in the order of the amorphous phase and the crystalline phase.

Also, in the case of the example sample $Al_{65}$, when the example sample $Al_{65}$ is rapidly solidified, the example sample $Al_{65}$ shows a quasicrystalline phase, and the magnitude of the specific resistance shows in the order of a quasicrystal→an approximant crystal of the two phases of the quasicrystal phase and the approximant crystal phase, and it is seen that the magnitude of the specific resistance of the quasicrystalline phase is more than 2 times, for example, about 4 times or more than that of the approximant crystalline phase.

Figure 9:
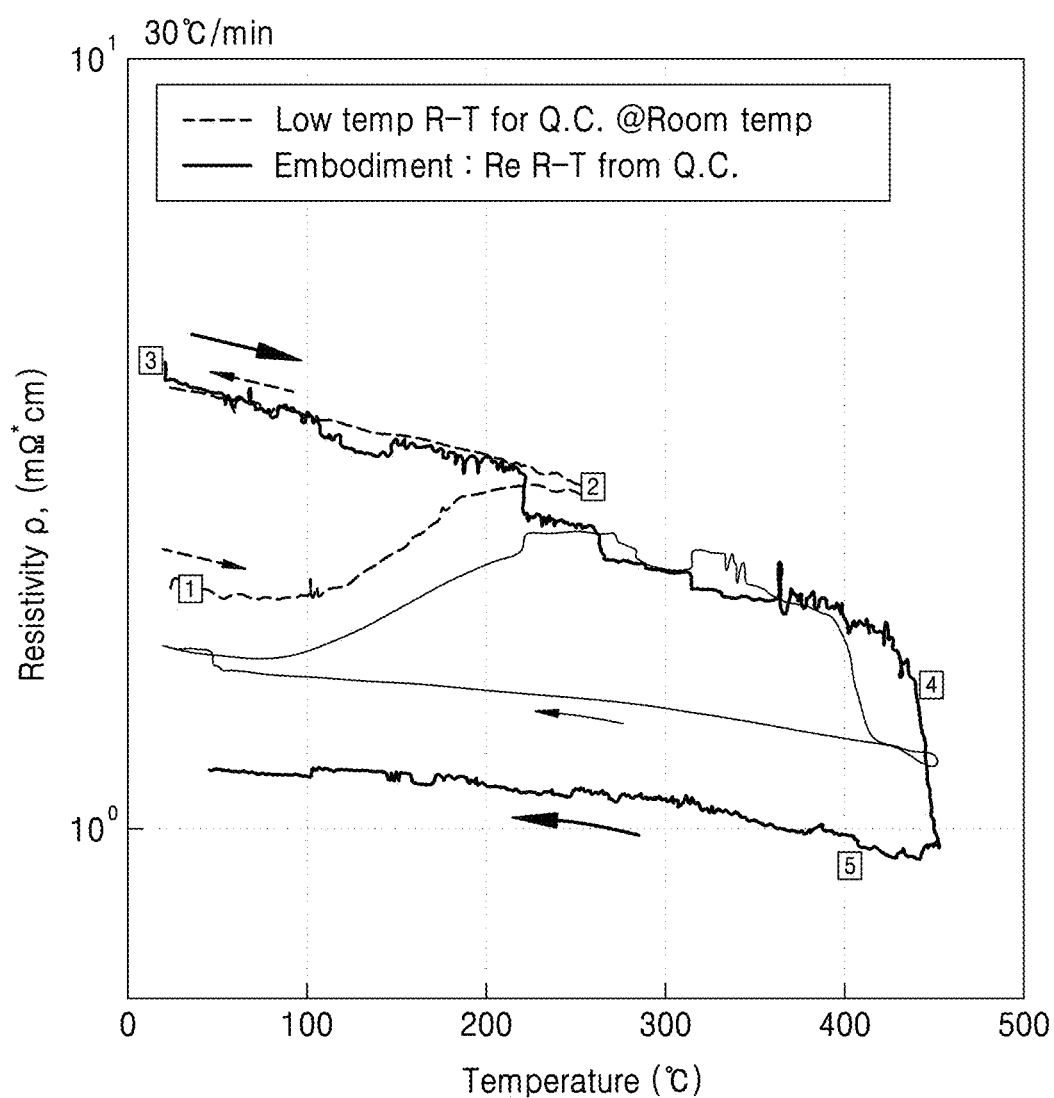
FIGS. 9 and 10 are graphs showing results of R-T testing with respect to an AlSiMn sample without capping for the AlSiMn sample.
Figure 10:
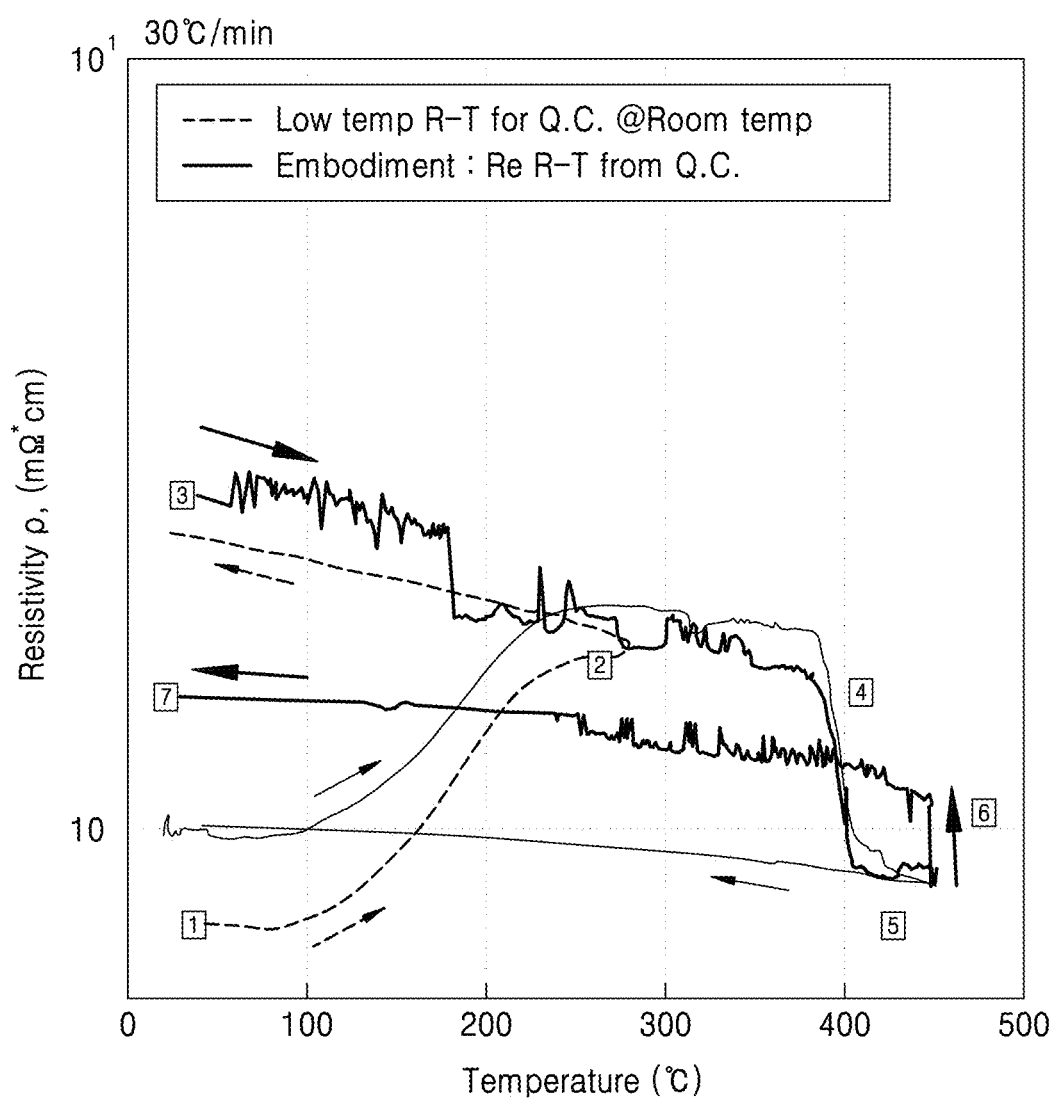

FIGS. 9 and 10 are graphs showing results of R-T tests without capping for AlSiMn samples.

Referring to FIGS. 9 and 10, dashed lines (①→②→③ path) show cases of tracing resistance in the R-T tests by raising the temperature in a range from about 250° C. to about 280° C. at a rate of 30° C./min and reducing the temperature to room temperature in order to confirm the resistance of the quasicrystals at the room temperature. Bold solid lines (e.g., ③→④→⑤ in FIG. 9 and ③→④→⑤→⑥→⑦ in FIG. 10) path show the results of the R-T tests by raising the temperature of the sample to 450° C. again. Both the samples of FIG. 9 and FIG. 10 show that there is a region in which the resistance rapidly decreases at about 400° C. or more, which indicates that there is a phase transition from a quasicrystal to an approximant crystal having a further regular atomic arrangement than the quasicrystal (quasicrystal→approximant crystal).

In FIGS. 9 and 10, paths of thin solid lines schematically indicate R-T circulation curves when the sample is heated from room temperature to a temperature at which the phase transition from a quasicrystal to an approximant crystal having a further regular atomic arrangement than the quasicrystal is achieved, and afterwards, the sample is solidified.

As it is seen from the results of the RT tests of FIGS. 9 and 10, there is a region where the resistance is rapidly reduced at a temperature of about 400° C. or more, and the AlSiMn sample has a phase transition from a quasicrystal to an approximant crystal having a further regular atom arrangement than the quasicrystalline phase (quasicrystal→approximant crystal phase transition).

As described above, the quasicrystalline material according to the present embodiment is based on a polyhedral quasicrystalline element having an axis of symmetry of 2-fold axis, 3-fold axis, 5-fold axis, or higher fold-axis, and may occur a phase transition between a quasicrystal and an approximant crystal having a more regular atom arrangement than the quasicrystalline phase, and thus, the quasicrystalline material may be used as a phase change material.

Also, in the quasicrystalline material according to the present embodiment, the phase transition is a one-step phase transition, and since the energy change during the phase transition from a quasicrystal to a crystal is not large, a rapid phase transition speed may be expected, and thus, low power operation is possible.

Accordingly, when a quasicrystalline material according to the embodiment is applied to the phase change layer of a semiconductor device, a semiconductor device, for example, a phase change memory device or a neuromorphic device that may be operated at a high phase transition speed and low power, may be realized.

Figure 11:
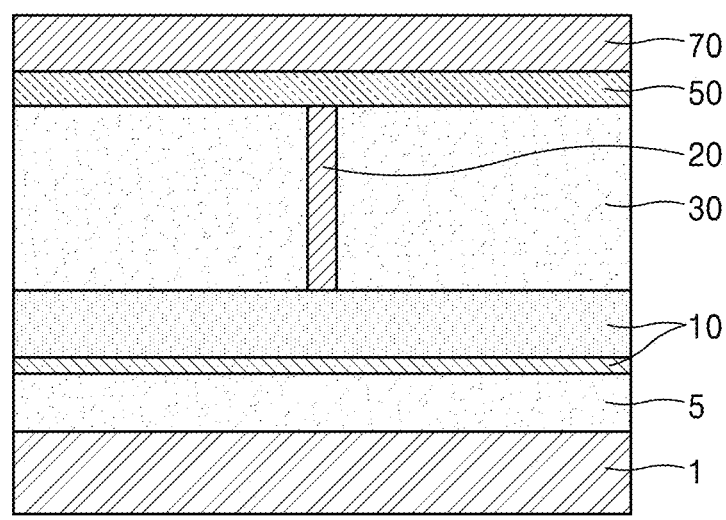
FIG. 11 is a schematic cross-sectional view of a semiconductor device in which a quasicrystalline material according to an embodiment is applied to a phase change layer.

FIG. 11 is a schematic cross-sectional view of a semiconductor device in which a quasicrystalline material according to an embodiment is applied to a phase change layer. FIG. 11 shows illustratively phase change memory device as a semiconductor device, and a semiconductor device in which a quasicrystalline material according to an embodiment is applied to a phase change layer may have various configurations.

Referring to FIG. 11, the semiconductor device according to the present embodiment may include first and second electrodes 20 and 70 apart from each other and a phase change layer 50 arranged therebetween.

The first electrode 20 may be a lower electrode. For example, the first electrode 20 may include a plug-type electrode. In this case, the first electrode 20 may be provided, for example, in a contact hole of an interlayer insulating layer 30. A pad-type electrode 10 may further be provided on a lower surface of the interlayer insulating layer 30 in contact with the first electrode 20. The second electrode 70 may include an upper electrode. The first electrode 20 formed as a plug-type electrode may be formed to have a width less than that of the phase change layer 50. The first electrode 20 may include a heating electrode or a resistive electrode as the lower electrode. The first electrode 20 and the second electrode 70 may include an electrode material used in the field of memory devices having a phase change layer, such as general phase change RAM or resistance change RAM.

The first electrode 20 may include at least one of various conductive materials, for example, titanium nitride (TiN), tantalum nitride (TaN), TiAlN, TaSiN, tungsten nitride (WN), tungsten nitride carbide (WNC), doped silicon (doped-Si), etc.

The second electrode 70 may include at least one of various conductive materials, for example, Al, Au, Cu, Ir, Ru, Pt, Ti, TiN, Ta, TaN, etc.

The pad-type electrode 10 that is in contact with the first electrode 20 may include at least one of various conductive materials, for example, Al, Au, Cu, Ir, Ru, Pt, Ti, TiN, Ta, TaN, etc. and may be formed as a single layer or a multi-layer structure. For example, the pad-type electrode 10 may be formed as, for example, a double layer structure of Al/Ti. The pad-type electrode 10 may include the same conductive material as that of the second electrode 70, or may include another conductive material. FIG. 11 shows a case that a phase change memory device includes the pad-type electrode 10, but a structure in which the pad-type electrode 10 is omitted is also possible.

The phase change layer 50 may be provided to store information by a resistance difference generated through a phase change by an electrical signal applied to the phase change layer 50 through the first and second electrodes 20 and 70.

The phase change layer 50 is based on a polyhedral quasicrystalline element having an axis of symmetry of 2-fold axis, 3-fold axis, 5-fold axis, or higher fold-axis, and may include various quasicrystal materials capable of phase changes between a quasicrystal phase and an approximant crystalline phase having a further regular atomic arrangement than the quasicrystal, according to the embodiments described above. The phase change layer 50 is capable of a phase transition between a quasicrystalline phase of a quasicrystalline material and an approximant crystalline phase having a further regular atomic arrangement than the quasicrystalline phase, which is an arranged quasiperiodically.

A quasicrystalline material applied to the phase change layer 50 as a phase change material may have various irregular arrangement structures of polyhedrons based on a polyhedral quasicrystalline element having an axis of symmetry of 2-fold axis, 3-fold axis, 5-fold axis, or higher fold-axis. For example, the quasicrystalline material applied to the phase change layer 50 as a phase change material may be one of an octagonal quasicrystal material having an 8-fold symmetry, a decagonal quasicrystal material having a 10-fold symmetry, a dodecagonal quasicrystal material having a 12-fold symmetry, a icosahedral quasicrystal material, and a stable binary quasicrystal material having a broken icosahedral symmetry.

At this point, a quasicrystalline material used as a phase change material in the phase change layer 50 includes a polyhedral cluster having a long range order structure and may include an irregular arrangement structure of the polyhedral cluster, and due to small phase transition energy and a large specific resistance difference with respect to the quasicrystalline phase and the approximant crystalline phase having a further regular atom arrangement than the quasicrystal, a high-speed phase change is possible. For example, a quasicrystalline material applied to the phase change layer 50 as a phase change material may be formed such that a resistance of a quasicrystalline phase is more than 2 times, for example, about 4 times or more than that of an approximant crystalline phase having a further regular atomic arrangement than the quasicrystalline phase.

A quasicrystalline material applied to the phase change layer 50 as a phase change material may include an icosahedral quasicrystal alloy based on Al, for example AlSiMn. A quasicrystalline material used as a phase change material in the phase change layer 50 may include one of octagonal quasicrystal materials, for example, V—Ni—Si, Cr—Ni—Si, Mn—Si, Mn—Si—Al, and Mn—Fe—Si. A quasicrystalline material applied to the phase change layer 50 as a phase change material may include one of decagonal quasicrystal materials, for example, Al-TM (here TM=Ir, Pd, Pt, Os, Ru, Rh, Mn, Fe, Co, Ni, or Cr), Al—Ni—Co, Al—Cu—Mn, Al—Cu—Fe, Al—Cu—Ni, Al—Cu—Co, Al—Cu—Co—Si, Al—Mn—Pd, V—Ni—Si, and Cr—Ni. A quasicrystalline material applied to the phase change layer 50 as a phase change material may include one of dodecagonal quasicrystal materials, for example, Cr—Ni, V—Ni, and V—Ni—Si.

A quasicrystalline material applied to the phase change layer 50 as a phase change material may include one of icosahedral quasicrystal materials, for example, Al—Fe—Mn, Al—Mn, Al—Mn—Si, Al—Li—Cu, Al—Pd—Mn, Al—Cu—Fe, Al—Mg—Zn, Zn—Mg-RE (here, RE=La, Ce, Nd, Sm, Gd, Dy, Ho, or Y), T—Zr—Ni Ti-TM (here, TM=Fe, Mn, Co, or Ni), Nb—Fe, V—Ni—Si, and Pd—U—Si. Also, a quasicrystalline material applied to the phase change layer 50 as a phase change material may include a stable binary quasicrystalline material having a broken icosahedral symmetry, for example, Cd—Yb.

Here, Al—Ni—Co, Al—Cu—Co, Al—Cu—Co—Si, Al—Mn—Pd, Al—Li—Cu, Zn—Mg-RE, and Cd—Yb may be materials in which stable phases are present.

By applying a quasicrystalline material that is based on a quasicrystalline element described above and is capable of phase change between a quasicrystalline state and an approximant crystalline state to the phase change layer 50, a semiconductor device may be able to have a phase change between a quasicrystalline state and an approximant crystalline state. Since an energy change in a process of transition from a quasicrystal to an approximant crystal is not large, the semiconductor device may expect a rapid phase transition speed. Thus, a semiconductor memory device, such as a phase change memory device or a neuromorphic device, may be realized. Also, when the semiconductor device is realized, a required (and/or desired) rapid phase transition speed may be obtained.

A stacking structure of a semiconductor device according to an embodiment may be formed on a substrate 1 having an insulating layer 5 on a surface thereof. The insulating layer 5 may include, for example, $SiO_2$ or various insulating materials besides $SiO_2$. The substrate 1 may include a silicon Si substrate or various types of substrates. For example, a semiconductor device according to an embodiment may be stacked on an SOI substrate.

According to such a semiconductor device, the phase of the phase change layer 50 may be changed by an electrical signal applied to the phase change layer 50 through the first electrode 20 and the second electrode 70. The phase change layer 50 may have a quasicrystalline state, and the phase of at least some regions of the phase change layer 50 may be changed to an approximant crystal state having a further regular atomic arrangement by application of an electrical signal than the quasicrystal state.

When a desired (and/or alternatively predetermined) electrical signal (electrical energy) is applied to the phase change layer 50 through the first electrode 20 and the second electrode 70, the phase of the phase change material in at least some regions of the phase change layer 50 may be changed, for example, from a quasicrystal state to an approximant crystal state having a further regular atomic arrangement than the quasicrystal state. The phase of remaining regions of the phase change layer 50 excluding the at least some regions may be a quasicrystal state. An operation of forming the phase change region in the phase change layer 50 may be referred to as a set operation. The resistance (electrical resistance) of the phase change layer 50 may be reduced by the set operation.

When an electric signal different from an electrical signal in the set operation is applied to the phase change layer 50 in a state that a phase change region transited to an approximant crystal phase is formed, the phase of the phase change region may be changed again. That is, the phase of the phase change region may be changed from the approximant crystal phase to a quasicrystal phase. As a result, the phase change layer 50 as a whole may have a quasicrystal phase. An operation of changing the phase of the phase change region back to a quasicrystal phase may be referred to as a reset operation. The resistance (electrical resistance) of the phase change layer 50 may be increased by the reset operation.

Here, the phase change layer 50 as a whole may have an approximant crystal phase instead of having a quasicrystal phase, and may be realized so that the phase of the phase change region is changed to a quasicrystal phase according to application of an electrical signal to the phase change layer 50.

Meanwhile, FIG. 11 shows, as an example, a case in which the first electrode 20 is formed as a plug-type electrode and a region of the phase change layer 50 adjacent to the first electrode 20 corresponds to the phase change region, but the present embodiment is not limited thereto. For example, instead of forming the first electrode 20 as a plug-type electrode, a portion of the phase change layer 50 may be formed as a plug-type, and in this way, a phase change may be caused only on a region of the plug-type portion of the phase change layer 50 according to an electrical signal applied between the first and second electrodes 20 and 70.

A semiconductor device according to an embodiment may include, for example, a Si substrate as the substrate 1, an $SiO_2$ layer having a thickness of about 300 nm as the insulating layer 5, an Al/Ti multilayer structure as the pad-type electrode 10 on the insulating layer 5, and the first electrode 20 as a TiN plug-type electrode in a contact hole of the interlayer insulating layer 30 including $SiO_2$. For example, the thickness of the first electrode 20 including the pad electrode 10 and the TiN plug-type electrode may be about 700 nm. For example, the phase change layer 50 including an AlSiMn material with a thickness of about 30 nm may be formed on the first electrode 20 and the interlayer dielectric layer 30, and the second electrode 70 including TiN with a thickness of about 50 nm may be formed on the phase change layer 50.

The quasicrystalline material according to an embodiment is capable of phase changes between a quasicrystalline state and an approximant crystalline state having a further regular atom arrangement than the quasicrystal. Accordingly, when the quasicrystalline material is applied to a phase change layer of a semiconductor device, it is possible to make a phase change between a quasicrystalline state and a crystal state. Also, a rapid phase change speed may be expected because the energy change in a process of changing from the quasicrystalline state to the crystal state is not large. Also, it is possible to realize a phase change memory device of a semiconductor memory device such as a neuromorphic device; and a required (and/or desired) phase change speed may be obtained when the device described is realized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A quasicrystalline material comprising:
   a polyhedral quasicrystalline element,
      the polyhedral quasicrystalline element having one or more of a 2-fold axis of symmetry, a 3-fold axis of symmetry, a 5-fold axis of symmetry, or a higher-fold axes of symmetry, the higher-fold axis of symmetry being greater than the 5-fold axis of symmetry, wherein the polyhedral quasicrystalline element having one of a pentagonal polyhedron quasicrystal material, an octagonal polyhedron quasicrystal material, a decagonal polyhedron quasicrystal material, a dodecagonal polyhedron quasicrystal material, an icohsahedral quasicrystal material, and a triacontahedral quasicrystal material,
   the quasicrystalline material being capable of a one-step phase transition between a quasicrystalline phase and an approximant crystalline phase,
      the approximant crystalline phase having a more regular atom arrangement than an atom arrangement of the quasicrystalline phase, and
      the atom arrangement of the quasicrystalline phase being arranged quasiperiodically.

2. The quasicrystalline material of claim 1, wherein
   the quasicrystalline material includes a polyhedron cluster, and
   the polyhedron cluster includes an irregular arrangement structure.

3. The quasicrystalline material of claim 1, wherein a specific resistance of the quasicrystalline phase is at least twice a specific resistance of the approximant crystalline phase.

4. The quasicrystalline material of claim 1, wherein the quasicrystalline material includes an Al-based alloy including V, Cr, or Mn, and
   the Al-based alloy includes an icosahedral quasicrystal, a decagonal quasicrystal, or an octagonal quasicrystal.

5. The quasicrystalline material of claim 4, wherein the quasicrystalline material includes AlSiMn as the Al-based alloy.

6. The quasicrystalline material of claim 1, wherein the quasicrystalline material includes at least one selected from the group consisting of V—Ni—Si, Cr—Ni—Si, Mn—Si, Mn—Si—Al, Mn—Fe—Si, Al-TM' (wherein TM' is Ir, Pd, Pt, Os, Ru, Rh, Mn, Fe, Co, Ni, or Cr), Al—Fe—Mn, Al—Ni—Co, Al—Cu—Mn, Al—Cu—Fe, Al—Cu—Ni, Al—Cu—Co, Al—Cu—Co—Si, Al—Mn—Pd, Al—Li—(Cu or Mg), Al—Re—Si, Al—Pd-TM (wherein TM is Fe, Ru or Os), Al—Cu—Ru, Al—Mg—(Ag, Cu, or Zn), Ga—Mg—Zn, V—Ni—Si, Cr—Ni,V—Ni, V—Ni—Si, Al—Mn, Al—Mn—Si, Al—Li—Cu, Al—Pd—Mn, Al—Cu—Fe, Al—Mg—Zn, Zn—Mg-RE (wherein RE is La, Ce, Nd, Sm, Gd, Dy, Ho, or Y), Ti—Zr—Ni, Ti-TM" (wherein TM is Fe, Mn, Co, or Ni), Nb—Fe, V—Ni—Si, Pd—U—Si, and Cd—Yb.

7. The quasicrystalline material of claim 1, wherein
   the quasicrystalline material is capable of the one-step phase transition between the quasicrystalline phase and the approximant crystalline phase, starting from the quasicrystalline phase without first transitioning from an amorphous phase to the quasicrystalline phase, when the quasicrystalline material is rapidly solidified.

8. The quasicrystalline material of claim 7, wherein a resistance of the quasicrystalline phase is at least twice a resistance of the approximant crystalline phase having a more regular atom arrangement than the quasicrystalline phase.

9. A semiconductor device comprising:
   a first electrode;
   a second electrode apart from the first electrode; and
   a phase change layer between the first electrode and the second electrode, wherein
   the phase change layer includes the quasicrystalline material of claim 1, and
   a phase of the phase change layer is configured to change between the quasicrystalline phase and the approximant crystalline phase in response to an electric signal applied to the phase change layer through the first electrode and second electrode.

10. The semiconductor device of claim 9, wherein
   the phase change layer includes a polyhedron cluster, and
   the polyhedron cluster includes an irregular arrangement structure.

11. The semiconductor device of claim 9, wherein
the quasicrystalline material includes an Al-based alloy including V, Cr, or Mn, and
the Al-based alloy includes an icosahedral quasicrystal, a decagonal quasicrystal, or an octagonal quasicrystal.

12. The semiconductor device of claim 11, wherein the phase change layer comprises AlSiMn.

13. The semiconductor device of claim 9, wherein the phase change layer comprises at least one selected from the group consisting of V—Ni—Si, Cr—Ni—Si, Mn—Si, Mn—Si—Al, Mn—Fe—Si, Al-TM' (wherein TM' is Ir, Pd, Pt, Os, Ru, Rh, Mn, Fe, Co, Ni, or Cr), Al—Fe—Mn, Al—Ni—Co, Al—Cu—Mn, Al—Cu—Fe, Al—Cu—Ni, Al—Cu—Co, Al—Cu—Co—Si, Al—Mn—Pd, Al—Li—(Cu,Mg), Al—Re—Si, Al—Pd-TM (wherein TM is Fe, Ru or Os), Al—Cu—Ru, Al—Mg—(Ag, Cu, or Zn), Ga—Mg—Zn, V—Ni—Si, Cr—Ni, V—Ni, V—Ni—Si, Al—Mn, Al—Mn—Si, Al—Li—Cu, Al—Pd—Mn, Al—Cu—Fe, Al—Mg—Zn, Zn—Mg-RE (wherein RE is La, Ce, Nd, Sm, Gd, Dy, Ho, or Y), Ti—Zr—Ni, Ti-TM" (wherein TM is Fe, Mn, Co, or Ni), Nb—Fe, V—Ni—Si, Pd—U—Si, and Cd—Yb.

14. The semiconductor device of claim 9, wherein
the semiconductor device includes a phase change memory device, and
the phase change memory device includes the phase change layer.

15. The semiconductor device of claim 9, wherein the semiconductor device includes a neuromorphic device.

16. A quasicrystalline material comprising:
a polyhedral quasicrystalline element capable of a phase change between a quasicrystalline phase and an approximant crystalline phase,
the approximant crystalline phase having a more regular atom arrangement than an atom arrangement of the quasicrystalline phase, and
the atom arrangement of the quasicrystalline phase being arranged quasiperiodically, and
the quasicrystalline material being capable of a one-step phase transition between a quasicrystalline phase and an approximant crystalline phase, wherein
the quasicrystalline material includes an Al-based alloy represented by Chemical Formula 1, $Al_aSi_bMn_c$, [Chemical Formula 1]

wherein, in Chemical Formula 1,
a is in a range of about 53 to about 68 at. %,
b is in a range of about 11 to about 27 at. %, and
c is in a range of about 16 to about 23 at. %.

17. The quasicrystalline material of claim 16, wherein
the quasicrystalline material is capable of forming the quasicrystalline phase without forming an amorphous phase when rapidly solidified after being plasma treated.

18. The quasicrystalline material of claim 16, wherein
a specific resistance of the quasicrystalline phase is at least twice a specific resistance of the approximant crystalline phase.

19. The quasicrystalline material of claim 18, wherein
the quasicrystalline material is capable of the one-step phase transition between the quasicrystalline phase and the approximant crystalline phase, starting from the quasicrystalline phase without first transitioning from an amorphous phase to the quasicrystalline phase, when rapidly solidified.

20. A semiconductor device, comprising:
a first electrode;
a second electrode apart from the first electrode; and
a phase change layer between the first electrode and the second electrode,
the phase change layer including the quasicrystalline material of claim 16.

* * * * *